(12) United States Patent
Ishizuka et al.

(10) Patent No.: US 11,056,381 B2
(45) Date of Patent: Jul. 6, 2021

(54) METHOD FOR PRODUCING BONDED SOI WAFER

(71) Applicant: SHIN-ETSU HANDOTAI CO., LTD., Tokyo (JP)

(72) Inventors: Toru Ishizuka, Takasaki (JP); Masatake Nakano, Annaka (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 71 days.

(21) Appl. No.: 15/754,003

(22) PCT Filed: Aug. 22, 2016

(86) PCT No.: PCT/JP2016/003798
§ 371 (c)(1),
(2) Date: Feb. 21, 2018

(87) PCT Pub. No.: WO2017/056376
PCT Pub. Date: Apr. 6, 2017

(65) Prior Publication Data
US 2018/0247860 A1    Aug. 30, 2018

(30) Foreign Application Priority Data
Sep. 28, 2015   (JP) .............................. JP2015-189399

(51) Int. Cl.
*H01L 21/762* (2006.01)
*H01L 27/12* (2006.01)
(Continued)

(52) U.S. Cl.
CPC ........ *H01L 21/76254* (2013.01); *H01L 21/02* (2013.01); *H01L 21/02008* (2013.01);
(Continued)

(58) Field of Classification Search
CPC ........... H01L 21/7624; H01L 21/76251; H01L 21/76254; H01L 21/02; H01L 21/02008;
(Continued)

(56) References Cited

U.S. PATENT DOCUMENTS 6,375,738 B1 * 4/2002 Sato .................. H01L 21/76259
117/104
6,544,656 B1 * 4/2003 Abe ........................ C30B 15/00
117/3
(Continued)

FOREIGN PATENT DOCUMENTS

JP    2003-068744 A    3/2003
JP    2003-224247 A    8/2003
(Continued)

OTHER PUBLICATIONS

Wolf et al., Silicon Processing for the VLSI Era, vol. 1—Process Technology, Lattice Press, Sunset Beach, CA, 19886, pp. 200-209.*
(Continued)

*Primary Examiner* — Mary A Wilczewski
(74) *Attorney, Agent, or Firm* — Oliff PLC

(57) ABSTRACT

A method for producing a bonded SOI wafer by bonding a bond wafer and a base wafer, each being formed of a silicon single crystal, together with a silicon oxide film placed therebetween, the method including: preparing, as the base wafer, a silicon single crystal wafer whose resistivity is 100 Ω·cm or more and initial interstitial oxygen concentration is 10 ppma or less; forming, on the front surface of the base wafer, a silicon oxide film by performing, on the base wafer, heat treatment in an oxidizing atmosphere at a temperature of 700° C. or higher and 1000° C. or lower for 5 hours or more; bonding the base wafer and the bond wafer together with the silicon oxide film placed therebetween; and thinning the bonded bond wafer to form an SOI layer.

6 Claims, 1 Drawing Sheet

(51) Int. Cl.
*H01L 21/02* (2006.01)
*H01L 21/322* (2006.01)
*C30B 15/00* (2006.01)
*C30B 15/20* (2006.01)
*C30B 29/06* (2006.01)

(52) U.S. Cl.
CPC .... *H01L 21/02236* (2013.01); *H01L 21/3226* (2013.01); *H01L 27/12* (2013.01); *H01L 27/1203* (2013.01); *C30B 15/007* (2013.01); *C30B 15/20* (2013.01); *C30B 29/06* (2013.01)

(58) Field of Classification Search
CPC ........... H01L 21/02236; H01L 21/3226; H01L 27/12; H01L 27/1203; C30B 15/007; C30B 15/20; C30B 29/06
See application file for complete search history.

(56) References Cited

U.S. PATENT DOCUMENTS

| | | | | |
|---|---|---|---|---|
| 6,613,678 | B1* | 9/2003 | Sakaguchi | H01L 21/2007 257/E21.122 |
| 9,634,098 | B2* | 4/2017 | Falster | H01L 21/02694 |
| 2002/0174828 | A1* | 11/2002 | Vasat | C30B 29/06 117/90 |
| 2003/0075260 | A1* | 4/2003 | Mitani | H01L 21/76251 156/153 |
| 2004/0003769 | A1* | 1/2004 | Tamatsuka | C30B 29/06 117/13 |
| 2005/0014346 | A1* | 1/2005 | Mitani | H01L 21/76254 438/459 |
| 2006/0177991 | A1* | 8/2006 | Murakami | H01L 21/76254 438/455 |
| 2007/0048971 | A1* | 3/2007 | Endo | H01L 21/762 438/459 |
| 2007/0196995 | A1* | 8/2007 | Aoki | H01L 21/76243 438/400 |
| 2008/0124929 | A1* | 5/2008 | Okuda | H01L 21/3225 438/692 |
| 2008/0213974 | A1* | 9/2008 | Okuda | H01L 21/02238 438/459 |
| 2009/0004825 | A1* | 1/2009 | Senda | H01L 21/76256 438/459 |
| 2010/0129993 | A1 | 5/2010 | Yokokawa et al. | |
| 2012/0238070 | A1* | 9/2012 | Libbert | H01L 21/76254 438/455 |
| 2013/0323153 | A1 | 12/2013 | Hoshi et al. | |
| 2014/0291815 | A1* | 10/2014 | Wilshaw | H01L 21/2605 257/629 |
| 2015/0104926 | A1* | 4/2015 | Libbert | H01L 21/76254 438/458 |
| 2015/0115480 | A1* | 4/2015 | Peidous | H01L 21/76251 257/798 |
| 2016/0276209 | A1* | 9/2016 | Usenko | H01L 21/76254 |
| 2017/0033002 | A1* | 2/2017 | Meguro | H01L 21/02 |
| 2017/0256442 | A1* | 9/2017 | Kweskin | H01L 21/76254 |
| 2017/0316968 | A1* | 11/2017 | Peidous | H01L 21/76254 |
| 2017/0338143 | A1* | 11/2017 | Peidous | H01L 21/76254 |
| 2017/0345663 | A1* | 11/2017 | Ishizuka | H01L 27/1203 |
| 2017/0372946 | A1* | 12/2017 | Peidous | H01L 21/02488 |
| 2018/0114720 | A1* | 4/2018 | Wang | H01L 21/02381 |
| 2018/0158721 | A1* | 6/2018 | Libbert | H01L 21/02236 |
| 2018/0182641 | A1* | 6/2018 | Lee | C30B 29/06 |
| 2018/0233400 | A1* | 8/2018 | Wang | H01L 21/02381 |

FOREIGN PATENT DOCUMENTS

| | | |
|---|---|---|
| JP | 2005-206391 A | 8/2005 |
| JP | 2012-076982 A | 4/2012 |
| JP | 2012-188293 A | 10/2012 |
| JP | 2014-107357 A | 6/2014 |
| KR | 100701314 B1 | 3/2007 |

OTHER PUBLICATIONS

Deat et al., General Relationship for the Thermal Oxidation of Silicon, Journal of Applied Physics, vol. 36m No. 12, Dec. 1965, pp. 3770-3778. (Year: 1965).*

Oct. 25, 2016 International Search Report issued in Patent Application No. PCT/JP2016/003798.

Apr. 29, 2019 extended European Search Report issued in European Application No. 16850559.2.

* cited by examiner

METHOD FOR PRODUCING BONDED SOI WAFER

TECHNICAL FIELD

The present invention relates to methods for producing a bonded SOI wafer.

BACKGROUND ART

Due to the development of portable terminals, Internet communication, and so forth, demand for the amount of information and the communication speed of the exchange of information by radio keeps on growing without limit. In recent years, the technology for doing miniaturization and integration by replacing a single device fabricated by using, for example, a silicon on sapphire (SOS) or GaAs substrate as a radio-frequency device such as a radio frequency (RF) switch with a device integrated on a Si substrate has been actively adopted. In particular, the method for fabricating a radio-frequency device by using a silicon on insulator (SOI) wafer is rapidly penetrating the marketplace.

A main performance item required of a radio-frequency device is to suppress a second-order harmonic and a third-order harmonic in order to prevent communication crosstalk. To satisfy this requirement, a substrate has to be an insulator. In an SOI wafer, increasing the thickness of a buried oxide film (BOX layer) is considered to be one method, but an oxide film has low thermal conductivity, which undesirably makes it impossible to remove heat which is generated when the radio-frequency device is operated. For this reason, a method using a Si substrate (a high resistivity substrate) having high resistivity as a support substrate (a base wafer) of an SOI wafer has been conceived. This makes it possible to suppress electrical conduction below the BOX layer and suppress harmonics of the radio-frequency device.

In this case, in order to reduce the influence of a reduction in resistivity caused by an oxygen donor to maintain high resistivity of the high resistivity substrate which is the base wafer, a low oxygen substrate is used. The use of such a high resistivity low oxygen substrate results in a Si crystal of high purity with less boron or oxygen in Si, which ends up causing a slip dislocation to be easily generated.

On the other hand, in order to improve an insulating property, an SOI wafer for a radio-frequency device is required to have a thick (for example, 500 nm or more) buried oxide film. In that case, in place of normal bond oxidation (forming an oxide film on the bond wafer's side), base oxidation (forming an oxide film on the base wafer's side) is used. The reason therefor is that, when a bonded SOI wafer is fabricated by using, for example, an ion implantation delamination method, high energy is needed to implant hydrogen on the bond wafer's side through a thick oxide film, and SOI film thickness uniformity, an increase in the number of particles, or the like becomes a problem. These are the main reasons why a base oxidation process is used. In doing so, long oxidation treatment is required because of large oxide film thickness.

In Patent Literature 1, as one of high resistivity silicon wafers that maintain high resistivity even after being subjected to heat treatment in a device production process, the wafers whose mechanical strength and gettering capability are high, a wafer doped with nitrogen is described, and using the wafer doped with nitrogen as a base wafer of an SOI wafer is described. Moreover, in paragraph (0032) of Patent Literature 1, a reduction in substrate resistivity of a wafer doped with nitrogen due to the influence of an oxygen/nitrogen donor (NO donor) is disclosed.

On the other hand, in paragraph (0038) and FIG. 1 of Patent Literature 2, annihilation of NO donors as a result of heat treatment being performed at 900° C. or higher is described. Moreover, in paragraph (0038) and paragraph (0039) of Patent Literature 3, annihilation of NO donors as a result of heat treatment being performed at 900° C. or higher, for example, 1000° C. for 16 hours is described.

CITATION LIST

Patent Literatures

Patent Literature 1: Japanese Unexamined Patent Publication (Kokai) No. 2012-76982
Patent Literature 2: Japanese Unexamined Patent Publication (Kokai) No. 2005-206391
Patent Literature 3: Japanese Unexamined Patent Publication (Kokai) No. 2012-188293

DISCLOSURE OF INVENTION

Problem to be Solved by the Invention

As described above, in an SOI wafer for a radio-frequency device, since a thick oxide film is formed to improve an insulating property, long oxidation treatment is required. Moreover, if the above heat treatment for annihilating donors is performed to suppress resistivity fluctuations, longer hours are spent, which undesirably impairs production efficiency. Furthermore, as described earlier, if a high resistivity low oxygen substrate is used, a slip dislocation is easily generated.

The present invention has been made in view of the above problems and an object thereof is to provide a method for producing a bonded SOI wafer, the method that can efficiently perform donor annihilation for suppression of fluctuations in resistivity while suppressing generation of a slip dislocation in a base wafer in an SOI wafer production process.

Means for Solving Problem

To attain the object, the present invention provides a method for producing a bonded SOI wafer by bonding a bond wafer and a base wafer, each being formed of a silicon single crystal, together with a silicon oxide film placed therebetween, comprising:

preparing, as the base wafer, a silicon single crystal wafer whose resistivity is 100 Ω·cm or more and initial interstitial oxygen concentration is 10 ppma or less;

forming, on a front surface of the base wafer, a silicon oxide film by performing, on the base wafer, heat treatment in an oxidizing atmosphere at a temperature of 700° C. or higher and 1000° C. or lower for 5 hours or more;

bonding the base wafer and the bond wafer together with the silicon oxide film placed therebetween; and thinning the bonded bond wafer to form an SOI layer.

By doing so, since it is possible to perform heat treatment for annihilating donors which doubles as long oxidation heat treatment at the time of the formation of a silicon oxide film on the base wafer front surface, it is possible to produce efficiently a bonded SOI wafer subjected to donor annihilation for suppressing fluctuations in resistivity while suppressing generation of a slip dislocation in a base wafer in an SOI wafer production process (hereinafter also referred to simply as an SOI process).

At this time, it is preferable that, as the base wafer, the silicon single crystal wafer whose nitrogen concentration is $1 \times 10^{13}$ to $1 \times 10^{15}$ atoms/cm$^3$ is used.

By using a base wafer doped with nitrogen in such a way that a concentration of nitrogen falls within such a range, it is possible to suppress generation of a slip dislocation in a device production process more reliably while suppressing generation of a dislocation when a silicon single crystal is being pulled upwardly.

Moreover, at this time, it is preferable that, in the forming the silicon oxide film, a thickness of the silicon oxide film which is formed on the front surface of the base wafer is 1 μm or more.

If such a thick oxide film which is 1 μm or more is formed for a buried oxide film (a BOX film), a slip dislocation is easily generated in the existing method; however, in the present invention, even when an oxide film whose thickness is 1 μm or more is formed, it is possible to suppress generation of a slip more effectively.

Effect of the Invention

With the method for producing a bonded SOI wafer of the present invention, it is possible to perform heat treatment that annihilates donors, which doubles as long oxidation heat treatment at the time of the formation of a silicon oxide film on a base wafer front surface, and efficiently produce a bonded SOI wafer subjected to donor annihilation for suppressing fluctuations in resistivity while suppressing generation of a slip dislocation in a base wafer in an SOI process.

BEST MODE(S) FOR CARRYING OUT THE INVENTION

Hereinafter, an embodiment of the present invention will be described, but the present invention is not limited thereto.

As described earlier, if a high resistivity low oxygen substrate is used, a slip dislocation is easily generated, and long heat treatment for annihilating donors is required to suppress fluctuations in resistivity, which undesirably results in low production efficiency.

Thus, the inventors of the present invention have conducted intensive studies to solve such a problem. As a result, the inventors of the present invention have found performing, on a base wafer, heat treatment at a temperature of 700° C. or higher and 1000° C. or lower for 5 hours or more in an oxidizing atmosphere in a process of forming a silicon oxide film on a base wafer front surface at the time of production of a bonded SOI wafer. The inventors of the present invention have found that this makes it possible to perform heat treatment that annihilates donors, which doubles as long oxidation heat treatment at the time of the formation of a silicon oxide film on a base wafer front surface, and efficiently produce a bonded SOI wafer subjected to donor annihilation for suppressing fluctuations in resistivity while suppressing generation of a slip dislocation in a base wafer in an SOI process. Then, the inventors of the present invention have closely examined the best mode for carrying out these processing and completed the present invention.

Figure 1:
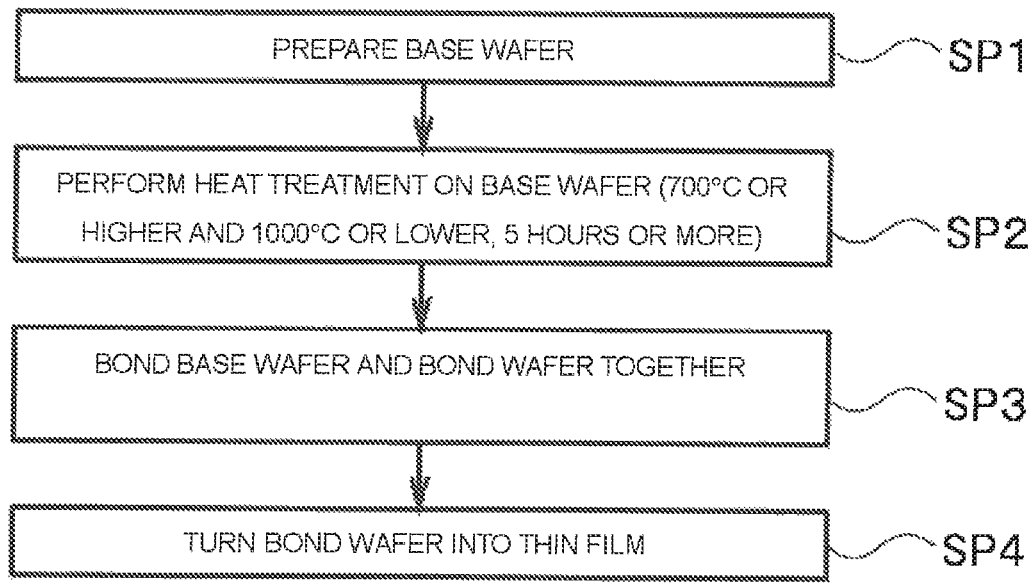
FIG. 1 is a process diagram showing an example of a method for producing a bonded SOI wafer of the present invention.
Figure 2:
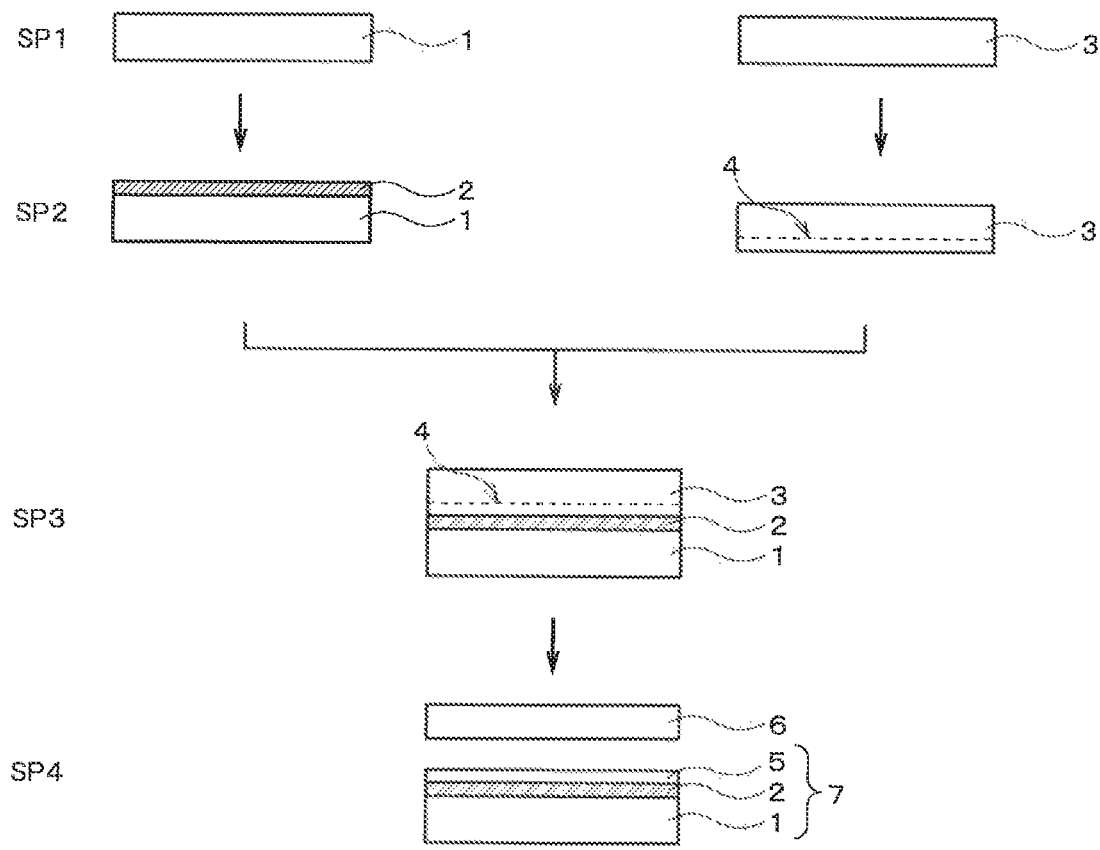
FIG. 2 is an explanatory diagram depicting an example of processes of the method for producing a bonded SOI wafer of the present invention.

Hereinafter, a method for producing a bonded SOI wafer of the present invention will be described with reference to FIGS. 1 and 2 showing an example of processes. Moreover, as the method for producing a bonded SOI wafer, a production method using an ion implantation delamination method will be taken up as an example, but the present invention is not limited thereto.

First, as depicted in FIG. 2, as a base wafer 1, a silicon single crystal wafer whose resistivity is 100 Ω·cm or more and initial interstitial oxygen concentration is 10 ppma or less is prepared (SP1 of FIGS. 1 and 2).

The base wafer 1 can be formed as a silicon single crystal wafer grown by the Czochralski method (the CZ method) and cut out from a silicon single crystal ingot, for example.

The resistivity of the base wafer 1 only has to be 100 Ω·cm or more and, more preferably, a silicon single crystal wafer whose resistivity is 1000 Ω·cm or more can be used. Depending on the requirement of second-order harmonic characteristics, a resistivity of 3000 Ω·cm or more or a resistivity of 7500 Ω·cm or more is designated in some cases.

Moreover, a target value of the oxygen concentration of the base wafer 1 is set at 10 ppma or less (ASTM'79) to prevent a change in resistivity caused by oxygen donors. Since it is difficult to fabricate a silicon single crystal whose oxygen concentration is lower than 1 ppma by the Czochralski method, it is preferable to set the oxygen concentration at 1 ppma or more.

In doing so, it is preferable that the base wafer 1 is a base wafer doped with nitrogen when a silicon single crystal is pulled upwardly. Also when a silicon single crystal is pulled upwardly in a common manner, the silicon single crystal is sometimes pulled upwardly in such a way as to achieve high resistivity and low oxygen; however, in this case, usually, nitrogen doping is not performed. If the base wafer 1 is a base wafer doped with nitrogen, it is possible to suppress generation of a slip in base oxidation heat treatment, bonding stabilization heat treatment, surface roughness improvement heat treatment, and film thickness adjustment heat treatment, which will be described later.

It is preferable to set a target value of a nitrogen concentration at a nitrogen content of $1 \times 10^{13}$ to $1 \times 10^{15}$ atoms/cm$^3$. In particular, $8 \times 10^{13}$ atoms/cm$^3$ or more is more preferable. If a nitrogen concentration is $1 \times 10^{13}$ atoms/cm$^3$ or more, it is possible to obtain more reliably the effect of improving a slip-resistant property achieved by nitrogen doping. It is possible to suppress more effectively generation of a slip in an SOI process and, in addition thereto, in a device process. Moreover, if a nitrogen concentration is $1 \times 10^{15}$ atoms/cm$^3$ or less, it is possible to suppress, for example, generation of a dislocation due to excessive precipitation when a silicon single crystal is being pulled upwardly and prevent degradation of the crystallinity of a silicon single crystal more reliably.

Furthermore, as a bond wafer 3, a silicon single crystal wafer is prepared.

Next, by performing heat treatment on the base wafer 1 in an oxidizing atmosphere at a temperature of 700° C. or higher and 1000° C. or lower for 5 hours or more, a silicon oxide film 2 is formed on the front surface of the base wafer 1 (SP2).

As described above, by making the temperature at which the silicon oxide film 2 is formed on the front surface of the base wafer 1 lower than that of the existing example, even when heat treatment (for example, bonding stabilization heat treatment, surface roughness improvement heat treatment, and film thickness adjustment heat treatment) in the subsequent SOI wafer production process is performed at high temperatures, it is possible to suppress generation of a slip dislocation. Moreover, also in a case in which the base wafer 1 doped with nitrogen is used, the oxidation time is made longer due to a lowered oxidation temperature, which also makes it possible to suppress generation of NO donors associated with nitrogen doping at the same time.

For instance, when an oxide film for a BOX film having a thickness of 1 μm or more is formed on the base wafer front surface, oxidation is usually performed at a temperature exceeding 1000° C. in order to enhance productivity. However, at a temperature exceeding 1000° C., a slip dislocation is more easily generated by heat treatment in the SOI wafer production process and, in addition thereto, by heat treatment in a device production process.

In the present invention, since base oxidation is performed at a low base oxidation temperature which is lower than or equal to 1000° C., even in such a case where a BOX film thickness is 1 μm or more (that is, the thickness of an oxide film which is formed on the base wafer front surface is 1 μm or more) in which a slip dislocation is easily generated in the existing method, it is possible to suppress generation of a slip dislocation effectively.

On the other hand, if an oxidation temperature at which the silicon oxide film 2 is formed on the front surface of the base wafer 1 is lower than 700° C., this is not efficient because extremely long heat treatment is required to obtain a relatively large oxide film thickness required for an SOI wafer for a radio-frequency device.

Moreover, in the present invention, since the base oxidation time is 5 hours or more, it is possible to annihilate donors sufficiently. On the other hand, if the base oxidation time is less than 5 hours, annihilation of donors becomes insufficient, which results in a change in resistivity. Therefore, with the present invention, it is possible to suppress resistivity fluctuations caused by the influence of donors.

On the other hand, the bond wafer 3 to be bonded can be formed as the bond wafer 3 having an ion implanted layer 4 by performing ion implantation thereon. As ionic species of ion implantation, there are hydrogen ions and helium ions. The ion implantation conditions such as a dose amount and an acceleration voltage can be appropriately determined based on a required thickness of a final SOI layer, an SOI film thickness processing stock removal thickness in the SOI production process, and the like.

Next, the base wafer 1 and the bond wafer 3 are bonded together with the silicon oxide film 2 placed therebetween (SP3).

Next, the bond wafer 3 bonded to the base wafer 1 is thinned, whereby an SOI layer 5 is formed (SP4).

At this time, by performing heat treatment at about 500° C. on the wafers bonded together, it is possible to delaminate the bond wafer 3 at the ion implanted layer 4 and fabricate a bonded SOI wafer 7 in which the silicon oxide film 2 and the SOI layer 5 are formed on the base wafer 1. Incidentally, at this time, a delamination wafer 6 is obtained.

Moreover, by further performing, on the bonded SOI wafer 7 fabricated in this manner, bonding stabilization heat treatment which is performed at 900° C. or higher for about 0.5 to 2 hours, surface roughness improvement heat treatment which is performed at 1100° C. or higher for about 1 to 4 hours, and sacrificial oxidation treatment for film thickness adjustment which is performed at 900° C. or higher for about 1 to 2 hours for SOI film thickness adjustment by using a resistance-heating heat treatment furnace or the like, the bonded SOI wafer 7 having a final target thickness can be obtained.

Here, if a wafer doped with nitrogen is used as the base wafer 1, NO donors are reduced to some extent only by these types of heat treatment in the SOI production process after delamination of the bond wafer 3, but only these types of heat treatment are not sufficient to annihilate donors, and the resistivity of the base wafer sometimes changes by NO donors as a result of low-temperature heat treatment in the device production process, for example. However, in the present invention, before these types of heat treatment are performed, long heat treatment, which is performed for 5 hours or more and doubles as base oxidation, is performed. Therefore, NO donors are sufficiently annihilated, and, even when low-temperature heat treatment, which is performed at 600° C. or 450° C., in which NO donors would be formed is then performed in the device production process or the like, it is possible to suppress a change in resistivity. This makes it possible to obtain a bonded SOI wafer which can stably maintain initial high resistivity.

It is to be noted that the heat treatment in the SOI production process after delamination of the bond wafer also includes, in addition to the resistance-heating heat treatment described above, a case in which short-time rapid heating/rapid cooling heat treatment such as rapid thermal anneal (RTA) is performed.

If the resistivity of a base wafer of a bonded SOI wafer which is used for a radio-frequency device is high, the second-order harmonic characteristics are improved. By using a Si device as an RF switch, for example, which has been implemented by using GaAs in the past, it is possible to fabricate a smaller device having more functions.

As described above, by making heat treatment for annihilating donors double as a base oxidation process, it is possible to annihilate the need to add heat treatment for annihilating donors as a separate process. This makes it possible to efficiently produce a stabilized bonded SOI wafer for RF which maintains initial high resistivity while suppressing generation of a slip dislocation of a base wafer in the SOI process.

Incidentally, the above description deals with an example in which the bond wafer 3 is thinned by the formation of the ion implanted layer 4 and delamination at the ion implanted layer 4, but the present invention is not limited thereto. For example, the bond wafer 3 can be turned into a thin film by combining grinding, polishing, etching, and so forth.

EXAMPLES

Hereinafter, the present invention will be described more specifically with Examples and Comparative Examples of the present invention, but the present invention is not limited to these examples.

Example 1

As a base wafer, a CZ silicon single crystal wafer (not doped with nitrogen) having an oxygen concentration of 6.8 ppma (ASTM'79), a resistivity of 2000 Ω·cm, and a diameter of 300 mm, the CZ silicon single crystal wafer which was p-type and whose crystal orientation was <100>, was prepared.

On this base wafer, pyrogenic oxidation whose oxidation temperature was 950° C. and oxidation time was 9.5 hours was performed, and a 1-μm silicon oxide film was grown on the base wafer front surface.

On this base wafer, heat treatment was performed at 650° C. for 1 hour and then the resistivity thereof was measured, which revealed that no change from 2000 Ω·cm was observed.

The base wafer and a bond wafer (p-type, <100>, 10 Ω·cm) in which hydrogen ions whose acceleration voltage was 50 keV and dose amount was $5.0 \times 10^{16}$ atoms/cm$^2$ were implanted were bonded together with the grown silicon oxide film on the base wafer front surface placed therebetween.

Then, by performing heat treatment on the wafers, which were bonded together, at 500° C. for 20 minutes, the bond wafer was delaminated at the ion implanted layer, and a bonded SOI wafer in which the silicon oxide film and the SOI layer were formed on the base wafer was fabricated.

By further performing, on the fabricated bonded SOI wafer, oxidation at 950° C. (bonding stabilization heat treatment), removal of the oxide film, inert gas (Ar) atmosphere annealing at 1200° C. (surface roughness improvement heat treatment), and oxidation at 950° C. (film thickness adjustment heat treatment), the SOI layer thickness was adjusted to 150 nm.

On this SOI wafer, heat treatment was performed at 650° C. for 1 hour. Then, the resistivity of the base wafer shortly after the completion of the SOI wafer was measured, which revealed that no change from 2000 Ω·cm was observed. Moreover, a slip dislocation in this SOI wafer was observed in an X-ray topography, which revealed that generation of a slip was not observed.

In Table 1, the implementation results in Example 1 are shown. It is to be noted that, in Table 1, the results of Examples 2 and 3 and Comparative Examples 1 to 3, which will be described later, are also shown.

Example 2

As a base wafer, a CZ silicon single crystal wafer having an oxygen concentration of 6.8 ppma (ASTM'79), a resistivity of 2000 Ω·cm, and a nitrogen concentration of $8.9 \times 10^{13}$ atoms/cm$^3$, the CZ silicon single crystal wafer which was 300 mm in diameter and p-type and whose crystal orientation was <100>, was prepared.

Then, in the same manner as in Example 1, an oxide film was formed on the base wafer.

On this base wafer, heat treatment was performed at 650° C. for 1 hour and then the resistivity thereof was measured, which revealed that no change from 2000 Ω·cm was observed.

In the same manner as in Example 1, after the base wafer and a bond wafer were bonded together with the grown silicon oxide film on the base wafer front surface placed therebetween and delamination was performed, by performing bonding stabilization heat treatment, removal of the oxide film, surface roughness improvement heat treatment, and film thickness adjustment heat treatment, the SOI layer thickness was adjusted to 150 nm.

On this SOI wafer, heat treatment was performed at 650° C. for 1 hour. Then, the resistivity of the base wafer shortly after the completion of the SOI wafer was measured, which revealed that no change from 2000 Ω·cm was observed. Moreover, a slip dislocation in this SOI wafer was observed in an X-ray topography, which revealed that generation of a slip was not observed as shown in Table 1.

Example 3

As a base wafer, a CZ silicon single crystal wafer having an oxygen concentration of 6.8 ppma (ASTM'79), a resistivity of 2000 Ω·cm, and a nitrogen concentration of $1.4 \times 10^{14}$ atoms/cm$^3$, the CZ silicon single crystal wafer which was 300 mm in diameter and p-type and whose crystal orientation was <100>, was prepared.

TABLE 1

| | | Example 1 | Example 2 | Example 3 | Comparative Example 1 | Comparative Example 2 | Comparative Example 3 |
|---|---|---|---|---|---|---|---|
| Nitrogen concentration (atoms/cm$^3$) | | No nitrogen | $8.9 \times 10^{13}$ | $1.4 \times 10^{14}$ | No nitrogen | $8.9 \times 10^{13}$ | $8.9 \times 10^{13}$ |
| Base oxidation | Temperature | 950° C. | 950° C. | 1000° C. | 1050° C. | 1100° C. | 950° C. |
| | Time | 9.5 h | 9.5 h | 5 h | 4 h | 3 h | 2 h |
| | Film thickness | 1 μm | 1 μm | 1 μm | 1 μm | 1 μm | 0.4 μm |
| Shortly after base oxidation | Change in resistivity | No change | No change | No change | No change | No change | Changed |
| Heat treatment in SOI production process | Bonding stabilization | 950° C. oxidation | 950° C. oxidation | 950° C. oxidation | 950° C. oxidation | 950° C. oxidation | — |
| | Roughness improvement | 1200° C. Ar | 1200° C. Ar | 1200° C. Ar | 1200° C. Ar | 1200° C. Ar | — |
| | Film thickness adjustment | 950° C. oxidation | 950° C. oxidation | 950° C. oxidation | 950° C. oxidation | 950° C. oxidation | — |
| Shortly after completion of SOI wafer | Change in resistivity | No change | No change | No change | No change | No change | Changed |
| | Slip | No slip | No slip | No slip | Slip generated | Slip generated | — |
| After device production heat treatment | Change in resistivity | — | No change | No change | No change | No change | Changed |
| | Slip | — | No slip | No slip | Slip generated | Slip generated | — |

On this wafer, a 1-μm oxide film was grown by pyrogenic oxidation whose oxidation temperature was 1000° C. and oxidation time was 5 hours.

On this base wafer, heat treatment was performed at 650° C. for 1 hour and then the resistivity thereof was measured, which revealed that no change from 2000 Ω·cm was observed.

In the same manner as in Example 1, after the base wafer and a bond wafer were bonded together with the grown silicon oxide film on the base wafer front surface placed therebetween and delamination was performed, by performing bonding stabilization heat treatment, removal of the oxide film, surface roughness improvement heat treatment, and film thickness adjustment heat treatment, the SOI layer thickness was adjusted to 150 nm.

On this SOI wafer, heat treatment was performed at 650° C. for 1 hour. Then, the resistivity of the base wafer shortly after the completion of the SOI wafer was measured, which revealed that no change from 2000 Ω·cm was observed. Moreover, a slip dislocation in this SOI wafer was observed in an X-ray topography, which revealed that generation of a slip was not observed as shown in Table 1.

On the SOI wafers with no slip dislocation which were fabricated in Examples 2 and 3, after heat treatment (a maximum temperature 1100° C.) was performed on the supposition of heat treatment in the device production process, a slip dislocation was observed again in an X-ray topography, which revealed that generation of a slip dislocation was not observed in Examples 2 and 3. Moreover, the resistivity of the base wafers at this time was measured, which revealed that no change from 2000 Ω·cm was observed.

As described above, in Examples 2 and 3 using the base wafers doped with nitrogen, it was possible to prevent generation of a slip dislocation and a change in resistivity in the device production process in addition to the SOI production process.

Comparative Example 1

As a base wafer, the same CZ silicon single crystal wafer as that in Example 1 was prepared.

On this base wafer, a 1-μm oxide film was grown by pyrogenic oxidation whose oxidation temperature was 1050° C. and oxidation time was 4 hours.

On this base wafer, heat treatment was performed at 650° C. for 1 hour and then the resistivity thereof was measured, which revealed that no change from 2000 Ω·cm was observed.

In the same manner as in Example 1, after the base wafer and a bond wafer were bonded together with the grown silicon oxide film on the base wafer front surface placed therebetween and delamination was performed, by performing bonding stabilization heat treatment, removal of the oxide film, surface roughness improvement heat treatment, and film thickness adjustment heat treatment, the SOI layer thickness was adjusted to 150 nm.

On this SOI wafer, heat treatment was performed at 650° C. for 1 hour. Then, the resistivity of the base wafer shortly after the completion of the SOI wafer was measured, which revealed that no change from 2000 Ω·cm was observed. However, a slip dislocation in this wafer was observed in an X-ray topography, which revealed that generation of a slip was observed.

Comparative Example 2

As a base wafer, the same CZ silicon single crystal wafer as that in Example 2 was prepared. Then, on this base wafer, a 1-μm oxide film was grown by pyrogenic oxidation whose oxidation temperature was 1100° C. and oxidation time was 3 hours.

On this base wafer, heat treatment was performed at 650° C. for 1 hour and then the resistivity thereof was measured, which revealed that no change from 2000 Ω·cm was observed.

In the same manner as in Example 1, after the base wafer and a bond wafer were bonded together with the grown silicon oxide film on the base wafer front surface placed therebetween and delamination was performed, by performing bonding stabilization heat treatment, removal of the oxide film, surface roughness improvement heat treatment, and film thickness adjustment heat treatment, the SOI layer thickness was adjusted to 150 nm.

On this SOI wafer, heat treatment was performed at 650° C. for 1 hour. Then, the resistivity of the base wafer shortly after the completion of the SOI wafer was measured, which revealed that no change from 2000 Ω·cm was observed. However, a slip dislocation in this wafer was observed in an X-ray topography, which revealed that generation of a slip was observed.

On the SOI wafers, in which a slip dislocation was generated, which were fabricated in Comparative Examples 1 and 2, after heat treatment (a maximum temperature 1100° C.) was performed on the supposition of heat treatment in the device production process, a slip dislocation was observed again in an X-ray topography, which revealed that the number of slip dislocations greatly increased in both cases. Moreover, the resistivity of the base wafers at this time was measured, which revealed that no change from 2000 Ω·cm was observed.

As described above, it is thought that, in Comparative Examples 1 and 2, since heat treatment at the time of the formation of a silicon oxide film on the base wafer front surface was performed at higher temperatures in shorter amounts of time than those in Examples, a slip dislocation was generated.

Comparative Example 3

As a base wafer, the same CZ silicon single crystal wafer as that in Example 2 was prepared. Then, on this base wafer, a 0.4-μm oxide film was grown by pyrogenic oxidation whose oxidation temperature was 950° C. and oxidation time was 2 hours.

On this base wafer, heat treatment was performed at 650° C. for 1 hour and then the resistivity thereof was measured, which revealed that the resistivity value was greatly changed to be 4000 Ω·cm. As described above, in Comparative Example 3, heat treatment at the time of the formation of a silicon oxide film on the base wafer front surface was performed at a low temperature in a short amount of time. As a result, it is thought that heat treatment for annihilating donors was insufficient and, when heat treatment by which NO donors would be generated was performed, a change in resistivity which was presumably caused by NO donors occurred.

On the other hand, it is thought that, in Examples 1 to 3, since heat treatment for annihilating donors, which doubles as long oxidation heat treatment at the time of the formation of a silicon oxide film on the base wafer front surface, was sufficiently performed, even when heat treatment at 650° C. for 1 hour, by which donors would be generated, was performed after base oxidation, donors were not generated and a change in resistivity did not occur.

Moreover, it is thought that, if, by using the base wafer as that in Comparative Example 3, the subsequent SOI wafer production process is performed and the device production heat treatment described above is performed, since NO donors are not sufficiently annihilated, a change in resistivity will occur. For this reason, the subsequent SOI wafer production process was not performed on the wafer of Comparative Example 3.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a bonded SOI wafer by bonding a bond wafer and a base wafer, each being formed of a silicon single crystal, together with a silicon oxide film placed therebetween, comprising:
    preparing, as the base wafer, a silicon single crystal wafer whose resistivity is 100 Ω·cm or more, initial interstitial oxygen concentration is 10 ppma or less, and nitrogen concentration is $1 \times 10^{13}$ to $1 \times 10^{15}$ atoms/cm$^3$;
    forming, on a front surface of the base wafer, a silicon oxide film for a BOX film whose thickness is 1 μm or more by performing, on the base wafer, heat treatment in an oxidizing atmosphere at a temperature of 700° C. or higher and 1000° C. or lower for 5 hours or more, the heat treatment doubling as annihilation of NO donors associated with nitrogen doping;
    bonding the base wafer and the bond wafer together with the silicon oxide film placed therebetween; and
    thinning the bonded bond wafer to form an SOI layer.

2. The method according to claim 1, wherein the resistivity is 1000 Ω·cm or more.

3. The method according to claim 1, wherein the resistivity is 3000 Ω·cm or more.

4. The method according to claim 1, wherein the resistivity is 7500 Ω·cm or more.

5. The method according to claim 1, wherein the nitrogen concentration is $8 \times 10^{13}$ to $1 \times 10^{15}$ atoms/cm$^3$.

6. The method according to claim 1, wherein the method does not include an additional separate heat treatment step for annihilating the NO donors associated with the nitrogen doping.

* * * * *